United States Patent
Tanaka

(10) Patent No.: US 12,106,983 B2
(45) Date of Patent: Oct. 1, 2024

(54) ANNEALING DEVICE AND ANNEALING METHOD

(71) Applicant: SUMITOMO HEAVY INDUSTRIES, LTD., Tokyo (JP)

(72) Inventor: Teppei Tanaka, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 694 days.

(21) Appl. No.: 17/336,932

(22) Filed: Jun. 2, 2021

(65) Prior Publication Data

US 2021/0287921 A1  Sep. 16, 2021

Related U.S. Application Data

(63) Continuation of application No. PCT/JP2019/045461, filed on Nov. 20, 2019.

(30) Foreign Application Priority Data

Dec. 3, 2018  (JP) ................................ 2018-226435

(51) Int. Cl.
| | | |
|---|---|---|
| *H01L 21/67* | (2006.01) | |
| *B23K 26/354* | (2014.01) | |
| *H01L 21/268* | (2006.01) | |
| *H01L 21/66* | (2006.01) | |

(52) U.S. Cl.
CPC ...... *H01L 21/67248* (2013.01); *B23K 26/354* (2015.10); *H01L 21/268* (2013.01); *H01L 21/67115* (2013.01); *H01L 22/26* (2013.01)

(58) Field of Classification Search
CPC .............. B23K 26/354; B23K 26/0853; B23K 26/0006; H01L 21/268; H01L 22/26; H01L 22/12
See application file for complete search history.

(56) References Cited

U.S. PATENT DOCUMENTS

2016/0181120 A1   6/2016  Hawryluk et al.

FOREIGN PATENT DOCUMENTS

| EP | 2 574 418 A1 | | 4/2013 |
|---|---|---|---|
| JP | 2008117877 A | * | 5/2008 |
| JP | 2013-074019 A | | 4/2013 |
| JP | 2017022333 A | * | 1/2017 |

OTHER PUBLICATIONS

Search Report issued in European Application No. 19893052.1, dated Jan. 21, 2022.
International Search Report issued in Application No. PCT/JP2019/045461, mailed Feb. 7, 2020.

* cited by examiner

*Primary Examiner* — Thien S Tran
(74) *Attorney, Agent, or Firm* — Michael Best & Friedrich LLP

(57) ABSTRACT

There is provided an annealing device including a heating unit that heats a surface of an annealing object to temporarily melt an outer layer portion, a sensor that detects thermal radiation light from the annealing object heated by the heating unit, and a processing unit that estimates an annealing result of the annealing object on the basis of a waveform showing a temporal change in an intensity of the thermal radiation light detected by the sensor.

6 Claims, 6 Drawing Sheets

ANNEALING DEVICE AND ANNEALING METHOD

RELATED APPLICATIONS

The contents of Japanese Patent Application No. 2018-226435, and of International Patent Application No. PCT/JP2019/045461, on the basis of each of which priority benefits are claimed in an accompanying application data sheet, are in their entirety incorporated herein by reference.

BACKGROUND

Technical Field

A certain embodiment of the present invention relates to an annealing device and an annealing method.

Description of Related Art

In the process of manufacturing an insulated gate bipolar transistor (IGBT), a buffer layer is formed in a deep region of about 1 to 3 µm from a back surface of a substrate. For this reason, it is necessary to activate a dopant ion-implanted into the deep region. The related art discloses a laser annealing device suitable for activation annealing of the dopant implanted into the deep region. Additionally, a method of melting an outer layer portion of a semiconductor wafer to activate impurities is also known.

SUMMARY

According to one aspect of the present invention, there is a provided an annealing device including: a heating unit that heats the surface of the annealing object to temporarily melt the outer layer portion; a sensor that detects thermal radiation light from the annealing object heated by the heating unit; and a processing unit that estimates an annealing result of the annealing object on the basis of a waveform showing a temporal change in an intensity of the thermal radiation light detected by the sensor.

According to another aspect of the present invention, there is provided an annealing method including: heating a part of the surface of the annealing object to melt the outer layer portion; and estimating an annealing result of the annealing object on the basis of a waveform showing a temporal change in an intensity of thermal radiation light from a heated spot of the annealing object.

DETAILED DESCRIPTION

The distribution of the activation rate of the impurities in the depth direction of the semiconductor wafer depends on the melting depth at the time of the activation annealing. In order to determine the quality of an annealing process, it is desirable to know the melting depth at the time of the annealing. There is a need for an annealing device and an annealing method capable of estimating the melting depth at the time of annealing.

The melting time can be obtained from the waveform showing the temporal change in the intensity of the thermal radiation light. The melting depth during heating depends on the melting time. Therefore, the annealing result such as the melting depth can be estimated from the melting time.

An annealing device and an annealing method according to an embodiment of the invention of the present application will be described with reference to FIGS. 1 to 6.

Figure 1:
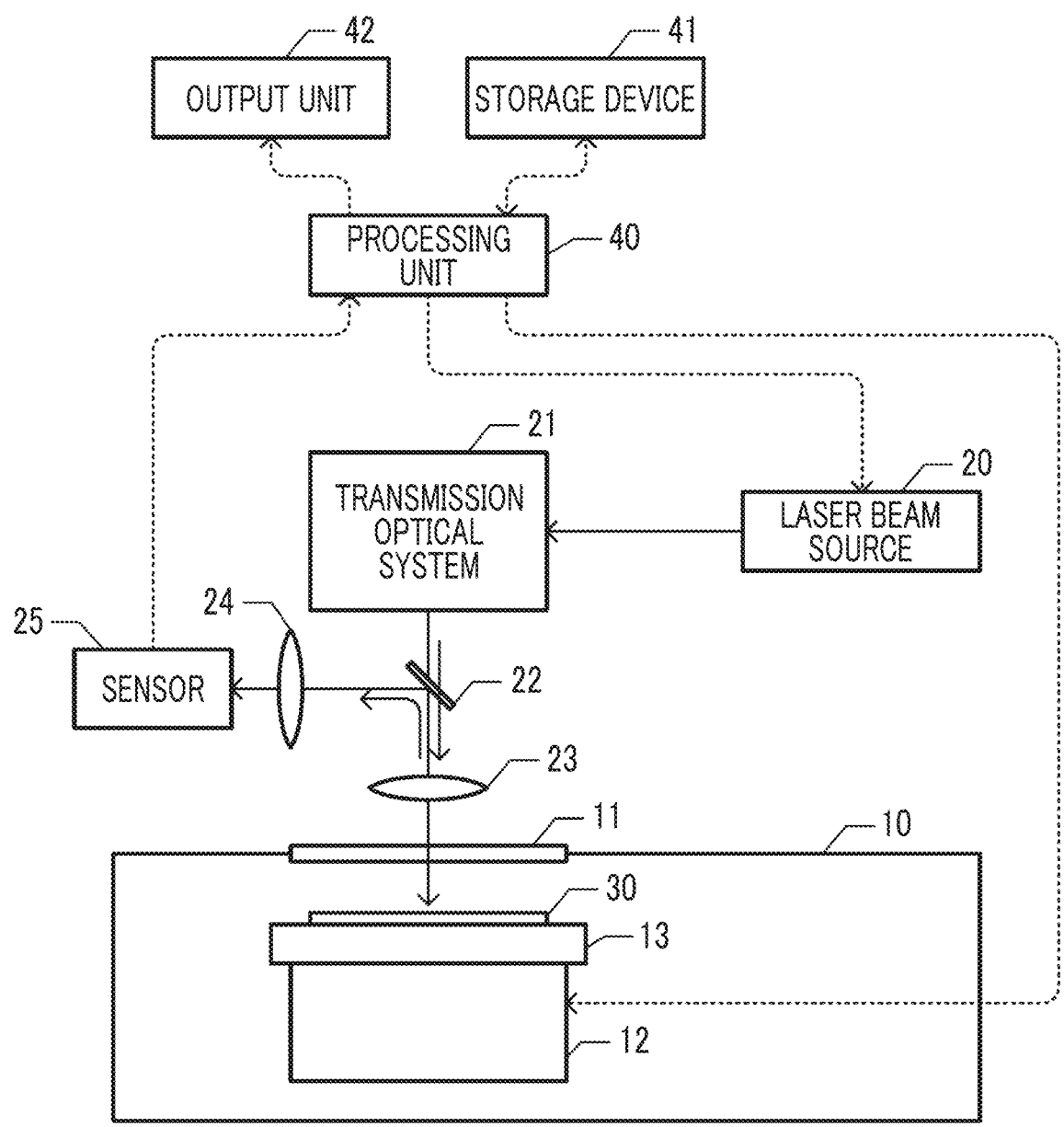
FIG. 1 is a schematic view of an annealing device according to an embodiment.

FIG. 1 is a schematic view of the annealing device according to the embodiment. A holding table 13 is supported in a chamber 10 by a scanning mechanism 12. The scanning mechanism 12 can receive a command from the processing unit 40 to move the holding table 13 in a horizontal plane. The scanning mechanism 12 includes an encoder and reads positional information representing the current position of the holding table 13 into a processing unit 40 from the encoder. An annealing object 30 is held on the holding table 13. The holding table 13 includes a vacuum chuck mechanism and vacuum-suctions and fixes the annealing object 30. The annealing object 30 is, for example, a semiconductor wafer such as a silicon wafer into which a dopant has been implanted. The laser annealing device according to the embodiment performs, for example, activation annealing of a dopant.

The laser beam source 20 receives a command from the processing unit 40 and outputs a pulsed laser beam for annealing. As the laser beam source 20, for example, a solid laser such as an Nd:YAG laser that outputs a pulsed laser beam in a green wavelength range is used. In addition, a green wavelength beam corresponds to the second harmonic. The laser beam output from the laser beam source 20 passes through a transmission optical system 21, a dichroic mirror 22, and a lens 23, is transmitted through a laser transmission window 11 provided on a top plate of the chamber 10, and is incident onto the annealing object 30. The dichroic mirror 22 transmits a pulsed laser beam for annealing. The transmission optical system 21 includes, for example, a beam homogenizer, a lens, a mirror, and the like. The beam homogenizer and the lens 23 shape a beam spot on the surface of the annealing object 30 and make the beam profile uniform.

As the pulsed laser beam is incident onto the annealing object 30, the annealing object 30 is locally heated. The thermal radiation light radiated from a heated spot of the annealing object 30 is transmitted through the laser transmission window 11, passes through the lens 23, is reflected by the dichroic mirror 22, and is further incident onto the sensor 25 through the lens 24. The dichroic mirror 22 reflects thermal radiation light in a wavelength range of about 900 nm or more. The sensor 25 measures the intensity of thermal radiation light in a specific wavelength range.

According to the Planck's law, the spectrum of thermal radiation light from a blackbody and the temperature of the blackbody are theoretically associated with each other. The spectrum of thermal radiation light from an actual object can be obtained on the basis of the emissivity and temperature of the object. For example, the spectrum of thermal radiation light from the annealing object 30, which is an actual object, changes depending on the temperature of the annealing object 30. For this reason, the intensity of thermal radiation light in a wavelength range measured by the sensor 25 also changes depending on the temperature of the annealing object 30. The measurement result of the thermal radiation light by the sensor 25 is input to the processing unit 40 as a voltage value.

The lens 23 and the lens 24 forms an image of the surface of the annealing object 30 on a light receiving surface of the sensor 25. Accordingly, the intensity of the thermal radiation light radiated from a surface region of the annealing object 30 having a conjugate relationship with the light receiving surface of the sensor 25 is measured. The surface region serving as a measuring object is set so as to be included inside the beam spot of the laser beam, for example.

The processing unit 40 controls the scanning mechanism 12 to move the annealing object 30 held on the holding table 13 in a two-dimensional direction in the horizontal plane. Moreover, the laser beam source 20 is controlled on the basis of the current positional information of the holding table 13 to output a pulsed laser beam from the laser beam source 20. When the pulsed laser beam is output while moving the annealing object 30, a heating spot moves within the surface of the annealing object 30.

Moreover, the processing unit 40 acquires a waveform (hereinafter, referred to as "waveform of intensity of thermal radiation light") showing the temporal change in the intensity of the thermal radiation light from the detection result of the sensor 25 for each irradiation with pulsed laser beam in synchronization with each shot of the pulsed laser beam output from the laser beam source 20. The acquired waveform of the intensity of the thermal radiation light is stored in the storage device 41 in association with the in-plane position of the annealing object 30.

In the present embodiment, the processing of making one laser pulse (first pulse) incident, and then making the next laser pulse (second pulse) incident after the elapse of an extremely short delay time is regarded as a single irradiation and is repeated a plurality of times. The incidence of the second pulse is performed during a period in which the influence of heat generation due to the incidence of the first pulse remains. In this way, the annealing in which two laser pulses are combined and a single irradiation is performed is referred to as "double pulse annealing" in the present specification. By adopting the double pulse annealing technique, in a case where a laser oscillator in which it is difficult to optionally adjust pulse width is used, substantially the same effect as increasing the pulse width can be obtained.

The processing unit 40 outputs information on the intensity distribution of thermal radiation light in the surface of the annealing object 30 to the output unit 42 as an image, a graph, or a numerical value. The output unit 42 includes a display unit for displaying the image.

Figure 2:
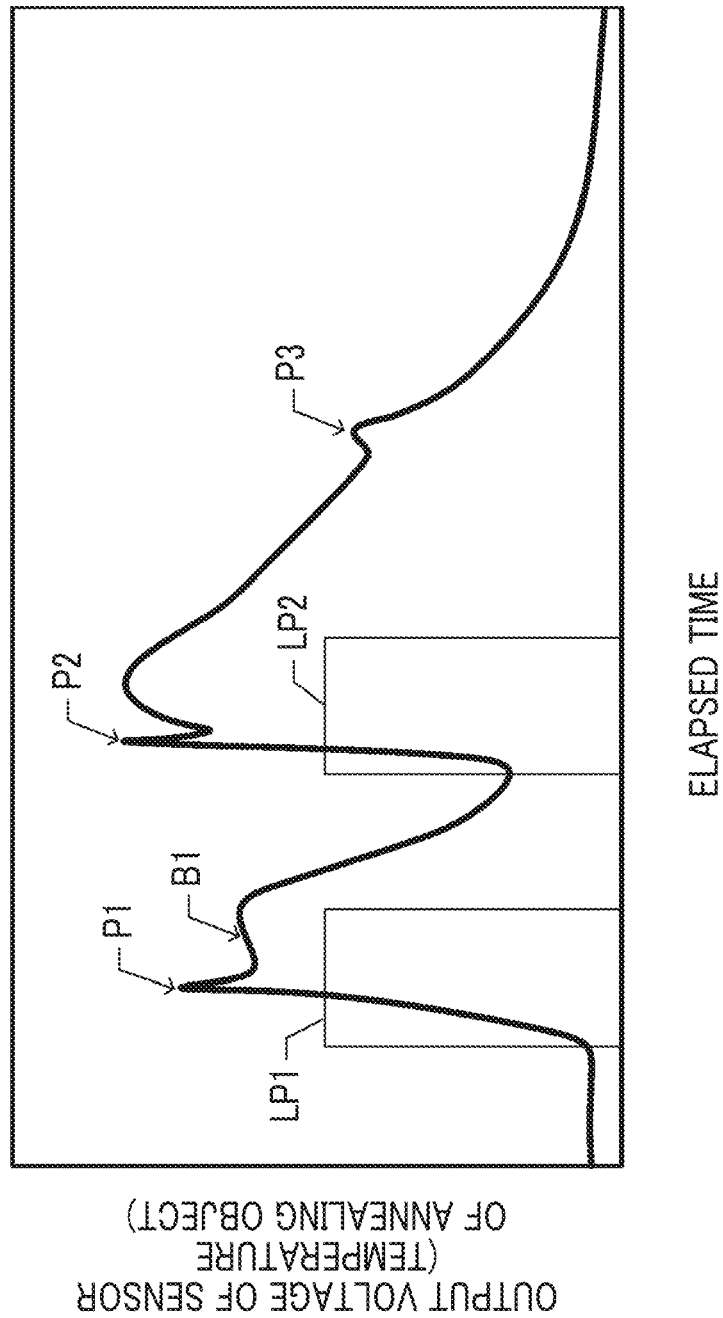
FIG. 2 is a graph showing an example of a waveform of thermal radiation light observed in a single irradiation with a pulsed laser beam.

FIG. 2 is a graph showing an example of the waveform of the thermal radiation light observed in a single irradiation with a pulsed laser beam, overlapped with a timing chart of laser pulses. The horizontal axis represents the elapsed time, and the vertical axis represents the output voltage of the sensor 25. The temporal change in the output voltage of the sensor 25 can be considered as the temporal change in the temperature of the annealing object 30.

The temperature of the annealing object 30 rises due to the incidence of a first pulse LP1, and a peak P1 appears. At this point of time, the temperature of the surface of the annealing object 30 reaches a melting point. As the temperature of the surface reaches the melting point, melting starts on the surface of the annealing object 30. A slightly flat portion B1 following the peak P1 indicates a period during which the energy input by the incidence of the first pulse LP1 is consumed as heat of fusion. Melting proceeds in the depth direction by consuming the input energy as the heat of fusion. Since the incidence of the first pulse LP1 continues even during this period, the temperature gently rises. When the incidence of the first pulse LP1 ends, the temperature starts to fall and solidification starts.

After that, the temperature of the annealing object 30 rises again due to the incidence of a second pulse LP2, and a peak P2 appears. In this case, the surface of the annealing object 30 is remelted. After that, melting proceeds in the depth direction. During a period in which the second pulse LP2 is incident, the output voltage of the sensor 25 (FIG. 1) rises and then starts to fall.

The following two points can be considered as the reasons why the output voltage of the sensor 25 rises after the peak P2 appears. A first point is that as the surface of the annealing object 30 melts into a liquid, the temperature thereof becomes higher and the intensity of the thermal radiation light becomes stronger than when the surface is a solid. A second point is that as the area of a melted portion of an observation object region where the intensity of the thermal radiation light is detected by the sensor 25 increases, the intensity of the thermal radiation light observed by the sensor 25 becomes strong. For the above two reasons, the output voltage of the sensor 25 rises.

The period in which the output voltage of the sensor 25 falls means that the heat near the surface is transferred to a deep region and the temperature near the surface falls due to heat dissipation from the surface.

When the incidence of the second pulse LP2 ends, the temperature continues falling, and the solidification proceeds from the deep region toward a shallow region. A peak P3 that appears when the temperature gradually falls is considered to be because the heat generated by the phase transition from a liquid phase to a solid phase was observed as a temporary temperature rise when the solidification proceeded to the surface. For this reason, the elapsed time from the peak P2 to the peak P3 corresponds to the melting time due to the incidence of the second pulse LP2.

Figure 3:
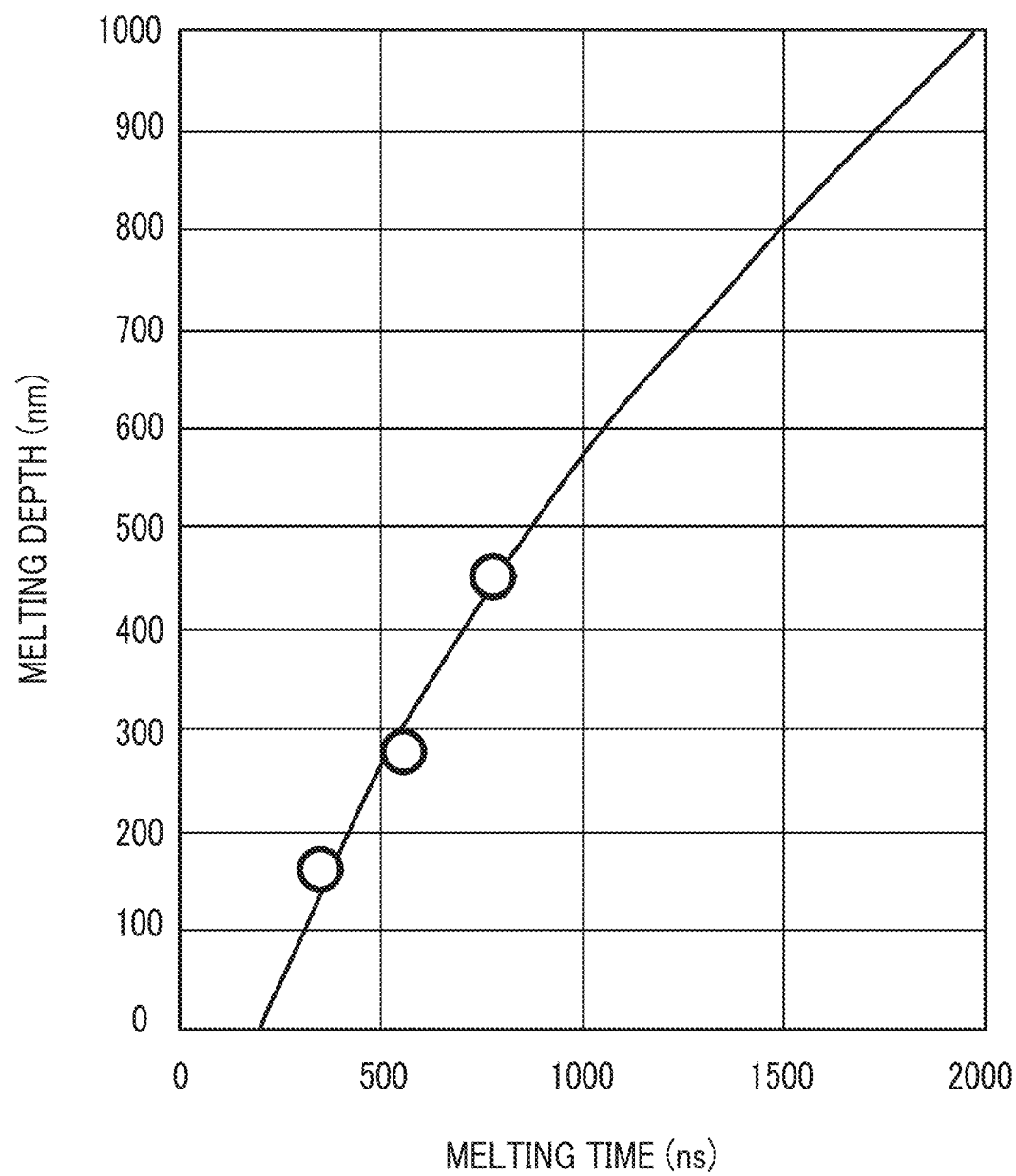
FIG. 3 is a graph showing a relationship between melting time and melting depth.

FIG. 3 is a graph showing an example of a relationship between the melting time and melting depth. The relationship between the melting time and the melting depth can be obtained by conducting an evaluation experiment in which an evaluation sample is actually annealed. An example of the evaluation experiment will be described below.

A pulsed laser beam is incident on a semiconductor wafer such as silicon in which boron is ion-implanted as a dopant to perform annealing. In a region melted by the annealing, as the dopant is diffused in the liquid, the dopant concentration becomes substantially constant in the depth direction. In a region deeper than an interface between the melted region and an unmelted region, the dopant concentration sharply decreases as the depth increases. For this reason, the melting depth can be determined by measuring the concentration distribution of the dopant in the depth direction of the semiconductor wafer. The dopant concentration distribution in the depth direction can be measured by, for example, secondary ion mass spectrometry (SIMS). The melting time during the annealing can be obtained from the temporal waveform of the output voltage of the sensor shown in FIG. 2.

The relationship between the melting time and the melting depth obtained by actually performing the evaluation experiment is shown in FIG. 3. The evaluation experiment was performed under three conditions of pulse energy density of 2.2 J/cm$^2$, 1.8 J/cm$^2$, and 1.4 J/cm$^2$. In FIG. 3, the actual measurement results are indicated by circle symbols, and an approximate curve thereof is shown. As the melting time is longer, the melting depth increases. The relationship between the melting time and the melting depth shown in FIG. 3 is stored in advance in the storage device 41.

Figure 4:
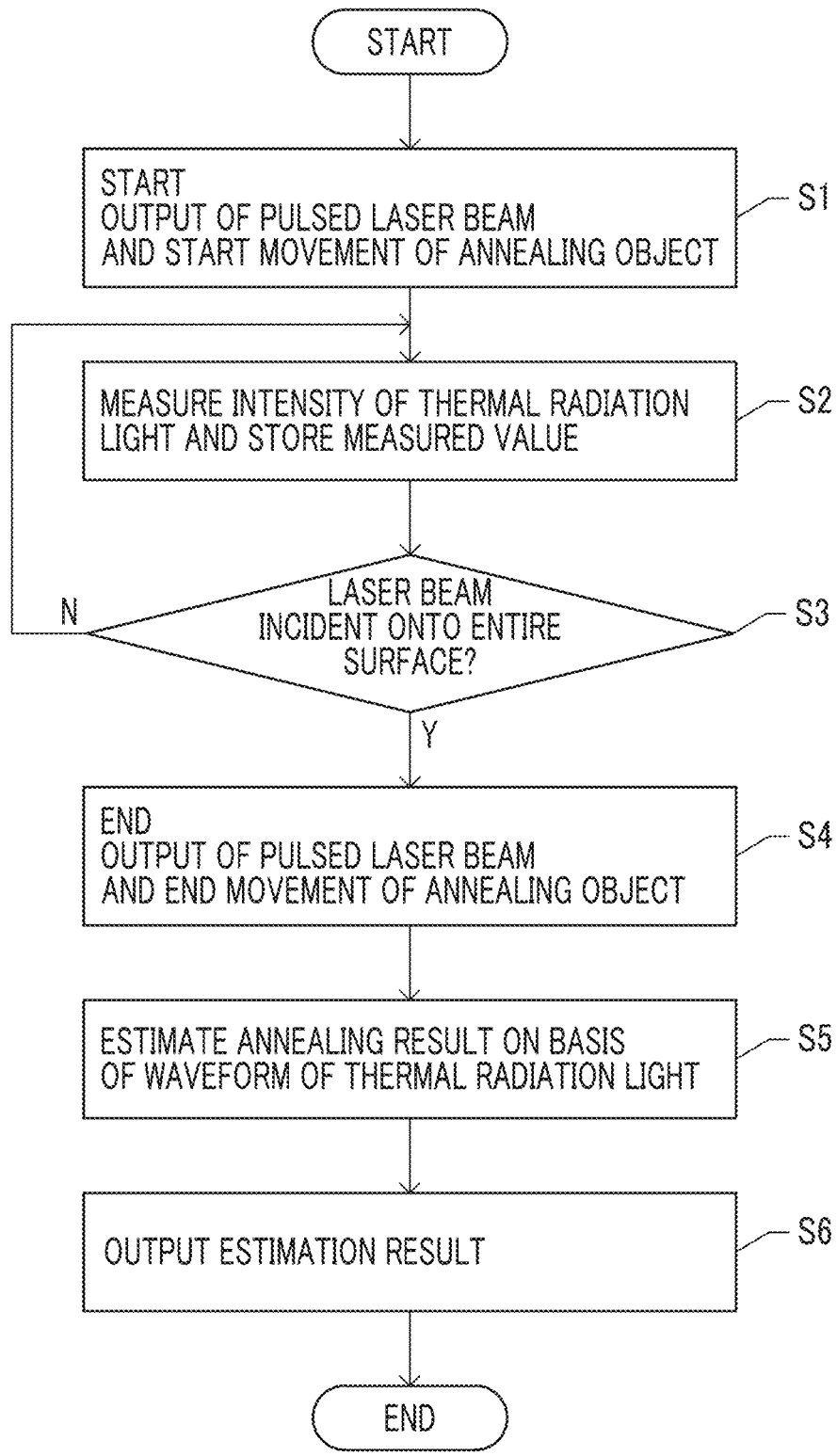
FIG. 4 is a flowchart of an annealing method according to the embodiment.

FIG. 4 is a flowchart of the annealing method according to the embodiment.

After the annealing object 30 is held on the holding table 13, the processing unit 40 controls the laser beam source 20 to start the output of the pulsed laser beam. Moreover, the scanning mechanism 12 is controlled to start the movement of the annealing object 30 held on the holding table 13 (Step S1). Accordingly, scanning of the surface of the annealing object 30 with the pulsed laser beam is started.

The processing unit 40 reads out the measured value of the intensity of the thermal radiation light from the sensor 25, associates the measured value with the incidence position of the pulsed laser beam, and stores the read-out result in the storage device 41 (Step S2). Step S2 is executed until the entire surface of the annealing object 30 is scanning with the pulsed laser beam (Step S3). When the entire surface of the annealing object 30 has been scanned with the pulsed laser beam, the processing unit 40 ends the output of the pulsed laser beam from the laser beam source 20. Moreover, the movement of the holding table 13 by the scanning mechanism 12 is ended (Step S4).

Next, the processing unit 40 reads out the measured value of the intensity of the thermal radiation light stored in the storage device 41, and estimates an annealing result on the basis of the waveform of the intensity of the thermal radiation light (Step S5). Specifically, the melting time is calculated on the basis of the characteristic shape of the waveform of the intensity of the thermal radiation light. For example, the peak P2 and the peak P3 of the waveform shown in FIG. 2 are detected, and the elapsed time from the peak P2 to the peak P3, that is, the melting time by the second pulse is calculated. Then, the melting depth at each position in the surface of the annealing object 30 is estimated on the basis of the calculated melting time and the relationship between the melting time and the melting depth shown in FIG. 3.

After the estimation of the annealing result, the processing unit 40 outputs the estimation result to the output unit 42 (Step S6). For example, the distribution of the melting depth in the surface of the annealing object 30 is displayed as a color-coded image.

Figure 5:
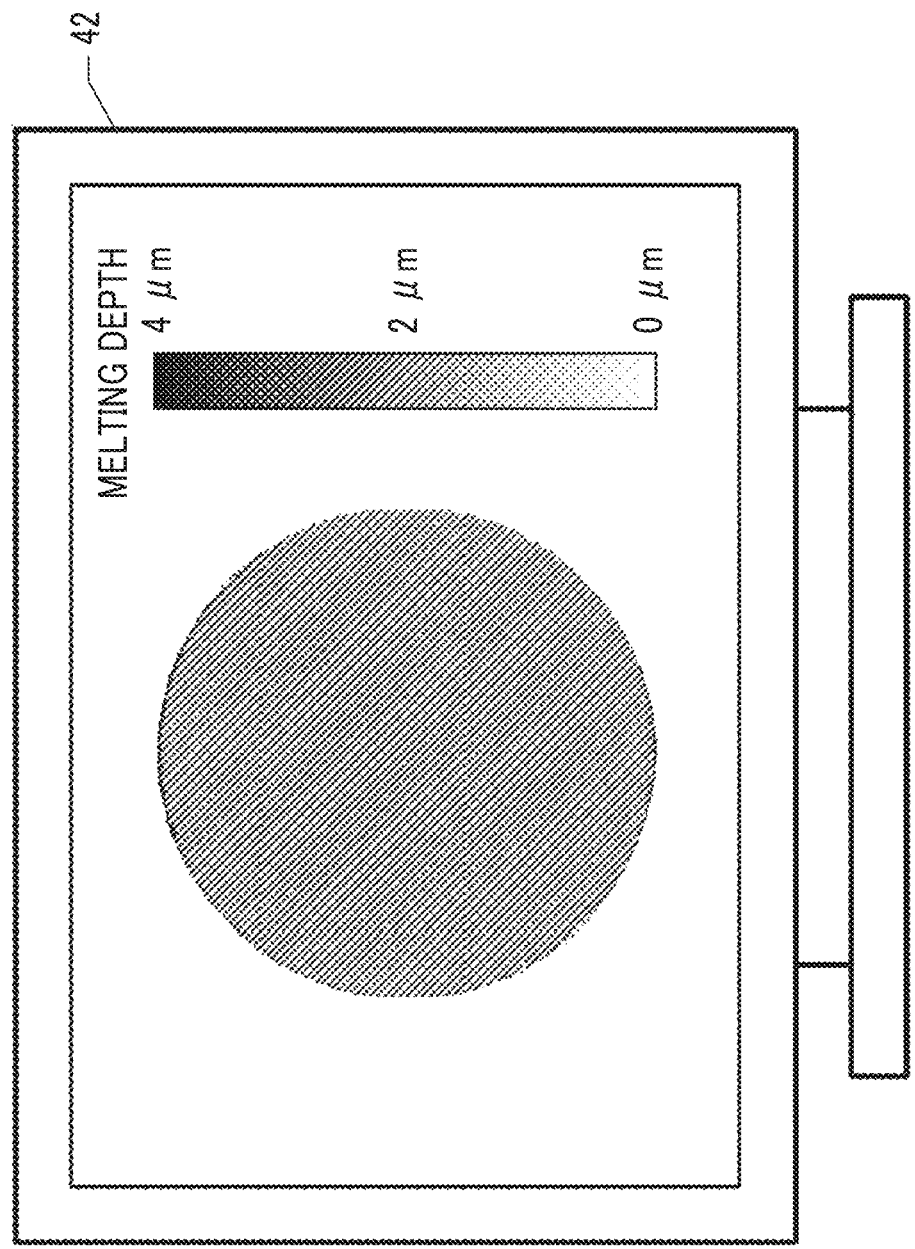
FIG. 5 is a view showing an example of an image displayed on an output unit.

FIG. 5 is a view showing an example of an image displayed on the output unit 42. The surface of the annealing object 30 is color-coded depending on the melting depth and displayed on a display screen.

Next, the excellent effects of the present embodiment will be described.

In the present embodiment, it is possible to estimate the distribution of the melting depth of a portion temporarily melted during annealing treatment without measuring the sheet resistance or the spread resistance with another device after the annealing treatment. An operator can determine whether or not the annealing treatment is normal by looking at the information displayed on the output unit 42.

The melting time can also be obtained by making reference light incident onto the surface of the annealing object 30 and detecting the intensity of the reflected light. In contrast to the method using the reference light and the reflected light, in the present embodiment, the intensity of the thermal radiation light radiated from the annealing object 30 is detected during the normal annealing treatment. Therefore, the melting depth can be estimated without disposing an optical system in which the reference light is made to be incident onto the annealing object 30.

Next, various modification examples of the above-described embodiment will be described.

In the above embodiment, after the annealing treatment for the annealing object 30 has ended in Step S4, the annealing result is estimated on the basis of the waveform of the thermal radiation light in Step S5. After the measurement of the intensity of the thermal radiation light has ended in Step S2 for each incidence of a laser pulse, it is possible to perform the processing of estimating the annealing result for a region onto which the laser pulse has been incident. Therefore, during a period in which the annealing is performed, the processing of estimating the annealing result of a region where the annealing has already ended may be executed in parallel.

In the above embodiment, the double pulse annealing technique is applied but it is not always necessary to apply this technique. For example, a single irradiation may be completed by making one laser pulse incident. In this case, in the waveform of the intensity of the thermal radiation light shown in FIG. 2, the two peaks P1 and P2 corresponding to the start of melting do not appear and only one peak appears. In this case, the time from one peak corresponding to the start of melting to the peak P3 corresponding to complete solidification may be considered as the melting time. Additionally, in a case where it is desired to further increase the effective pulse width, three or more laser pulses may be made to be incident onto the annealing object 30 with an extremely short delay time.

In the above embodiment, the laser beam source 20, the transmission optical system 21, and the lens 23 shown in FIG. 1 have a function as a heating unit that heats the annealing object 30. In the above embodiment, the pulsed laser beam in the green wavelength range is used as the pulsed laser beam for annealing. However, a pulsed laser beam in another wavelength range capable of melting an outer layer portion of the annealing object 30 may be used. Additionally, another energy beam may be used instead of the pulsed laser beam for heating. In this way, a device having a heating function other than the laser beam source may be used as the heating unit.

Additionally, in the above embodiment, the processing unit 40 estimates an annealing result and outputs the estimation result to the output unit 42. It is preferable that the processing unit 40 is capable of estimating the annealing result (melting depth) and further determining the quality of the annealing treatment on the basis of the estimation result of the melting depth. For example, the processing unit 40 may determine that the annealing treatment is poor in a case where the melting depth is out of an allowable range and may determine that the annealing result is good in a case where the melting depth is within the allowable range. Moreover, the processing unit 40 may perform the processing of advancing the annealing object 30 after the annealing treatment to the next process in a case where the annealing result is good, and may issue an alarm from the output unit 42 to notify the operator of the occurrence of the poor annealing in a case where it is determined that the annealing result is poor.

Next, an annealing device and an annealing method according to another embodiment will be described with reference to FIGS. 6A and 6B. Hereinafter, the description of the same components as those of the annealing device and the annealing method according to the embodiment described with reference to FIGS. 1 to 5 will be omitted.

In the embodiment described with reference to FIGS. 1 to 5, the characteristic shape of the waveform of the intensity of the thermal radiation light is detected, and the melting time is calculated on the basis of the shape. In contrast, in the present embodiment, the melting time is calculated on the basis of the area of the waveform of the intensity of the thermal radiation light. A method of calculating the melting time from the waveforms of the intensity of the thermal radiation light will be described with reference to FIGS. 6A and 6B.

The annealing treatment was actually performed under a plurality of conditions in which the energy density per pulse (pulse energy density) was different, and the melting time and the area of the waveform were obtained.

Figure 6A:
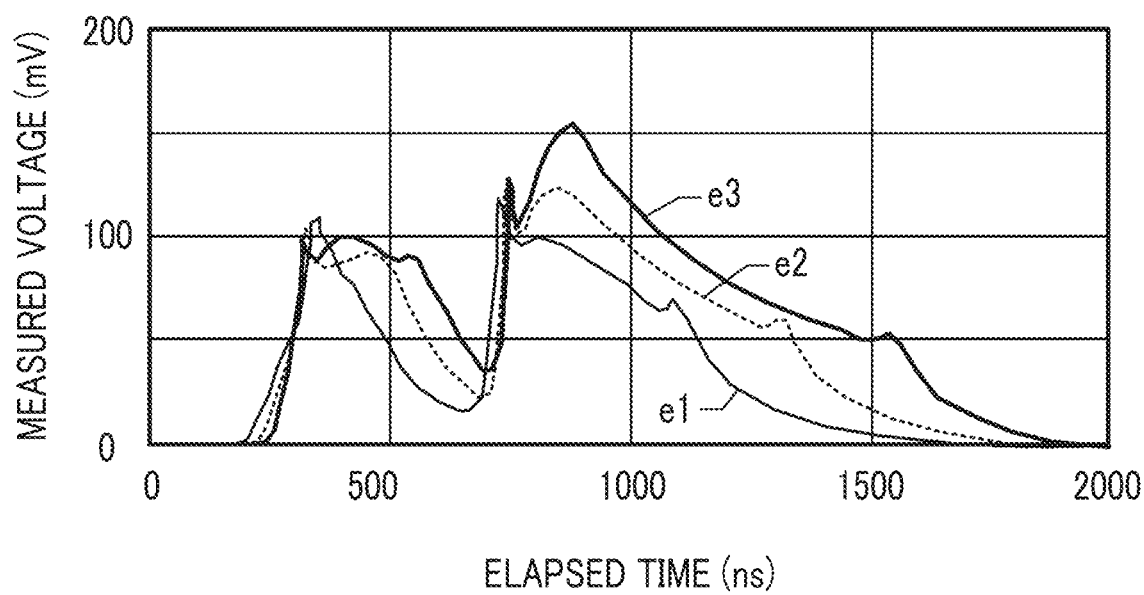
FIG. 6A is a graph showing waveforms of the intensity of the thermal radiation light actually measured.

FIG. 6A is a graph showing waveforms of the intensity of the thermal radiation light actually measured. The horizontal axis represents the elapsed time in units of "ns", and the vertical axis represents the output voltage of the sensor 25 (FIG. 1) in units of "mV". That is, the vertical axis of the graph shown in FIG. 6A represents the intensity of thermal radiation light. A thin solid line e1, a broken line e2, and a thick solid line e3 in the graph indicate the waveforms of the intensity of the thermal radiation light when the annealing is performed is under the conditions that the pulse energy density is 1.4 J/cm², 1.8 J/cm², and 2.2 J/cm², respectively.

Figure 6B:
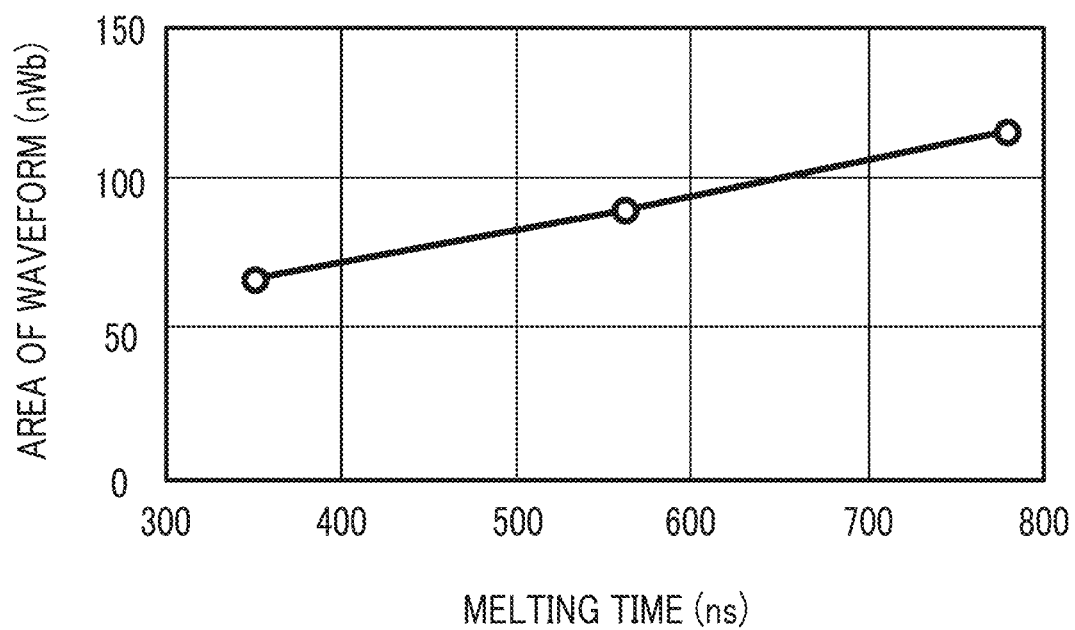
FIG. 6B is a graph showing a relationship between the melting time obtained from the waveforms shown in FIG. 6A and the area of the waveforms of the intensity of the thermal radiation light.

FIG. 6B is a graph showing a relationship between the melting time obtained from the waveforms shown in FIG. 6A and the area of the waveforms of the intensity of the thermal radiation light. The horizontal axis represents the melting time in units of "ns", and the vertical axis represents the area of the waveforms in units of "nWb". Here, as the area of the waveforms, the area in the period from the point of time when a waveform has risen from a base level due to the incidence of the first pulse to the point of time when the incidence of the second pulse ends and the waveform returns to the base level was adopted. It can be seen that the melting time t and the area S of the waveforms have a substantially linear relationship. From the graph shown in FIG. 6B, the following approximate equation is derived.

$$S = A \cdot t + C$$

$$A = 0.1171 \text{ (nWb/ns)}$$

$$C = 23.976 \text{ (nWB)} \quad (1)$$

Here, S and t represent the area of the waveforms and the melting time, respectively. A and C are constants.

The melting time t can be obtained from the calculation results of the area S of the waveforms and the graph of the relationship shown in FIG. 6B or Equation (1). When the melting time t is obtained, the melting depth can be obtained on the basis of the relationship shown in FIG. 3.

Next, the excellent effects of the present embodiment will be described.

In the present embodiment, the melting depth can be estimated by calculating the area of the waveforms without detecting the characteristic shape of the waveform of the intensity of the thermal radiation light. The area of the waveform scan be calculated, for example, by simply adding the output voltage values obtained with a predetermined time step width from the sensor 25 (FIG. 1). In contrast, in order to detect the characteristic shape of the waveform, it is necessary to perform the processing of removing noise superimposed on the waveform, a differential calculation, comparison determination processing, and the like. Therefore, the processing of calculating the area of the waveforms is completed in a shorter time than the processing of detecting the characteristic shape of the waveform. For this reason, when the method according to the present embodiment is used, it is possible to inspect all of the annealing objects 30 in a line every time the annealing treatment of the annealing objects 30 ends.

It is needless to say that the above-described respective embodiments are merely examples, and partial replacement or combination of the components shown n different embodiments is possible. The same operational effects by the same components of the plurality of embodiments will not be sequentially described for each embodiment. Moreover, the present invention is not limited to the above-described embodiments. For example, it will be apparent to those skilled in the art that various modifications, improvements, combinations, and the like can be made.

It should be understood that the invention is not limited to the above-described embodiment, but may be modified into various forms on the basis of the spirit of the invention. Additionally, the modifications are included in the scope of the invention.

What is claimed is:

1. An annealing device comprising:
   a heating unit that heats a surface of an annealing object to temporarily melt an outer layer portion;
   a sensor that detects thermal radiation light from the annealing object heated by the heating unit; and
   a processing unit that estimates an annealing result of the annealing object on a basis of a waveform showing a temporal change in an intensity of the thermal radiation light detected by the sensor,
   wherein the waveform includes a peak corresponding to a start of melting and a peak corresponding to complete solidification, and
   the processing unit estimates a melting depth of the outer layer portion of the annealing object on a basis of a melting time from the peak to the peak.

2. The annealing device according to claim 1,
   wherein the processing unit obtains a melting time of the outer layer portion of the annealing object on a basis of a characteristic shape of the waveform showing the temporal change in the intensity of the thermal radiation light detected by the sensor.

3. An annealing device comprising:
   a heating unit that heats a surface of an annealing object to temporarily melt an outer layer portion;
   a sensor that detects thermal radiation light from the annealing object heated by the heating unit; and
   a processing unit that estimates an annealing result of the annealing object on a basis of a waveform showing a temporal change in an intensity of the thermal radiation light detected by the sensor,
   wherein the processing unit estimates a melting depth of the outer layer portion of the annealing object on a basis of an area of the waveform showing the temporal change in the intensity of the thermal radiation light detected by the sensor.

4. The annealing device according to claim 2, further comprising:

a display unit that displays an image, wherein the heating unit moves a heating spot on the surface of the annealing object, and the processing unit associates a position in the surface of the annealing object with the estimated melting depth and displays a distribution of the melting depth on the display unit.

5. The annealing device according to claim 1, wherein the processing unit determines a quality of the annealing result on a basis of the intensity of the thermal radiation light detected by the sensor.

6. An annealing method comprising:

heating a part of a surface of an annealing object to melt an outer layer portion; and estimating an annealing result of the annealing object on a basis of a waveform showing a temporal change in an intensity of thermal radiation light from a heated spot of the annealing object, wherein the waveform includes a peak corresponding to a start of melting and a peak corresponding to complete solidification, and the annealing method further comprises:

estimating a melting depth of the outer layer portion of the annealing object on a basis of a melting time from the peak to the peak.

* * * * *